(12) United States Patent
Chen et al.

(10) Patent No.: US 11,088,182 B2
(45) Date of Patent: Aug. 10, 2021

(54) METHOD FOR TRANSFERRING LIGHT EMITTING ELEMENTS, DISPLAY PANEL, METHOD FOR MAKING DISPLAY PANEL, AND SUBSTRATE

(71) Applicant: Century Technology (Shenzhen) Corporation Limited, Shenzhen (CN)

(72) Inventors: Po-Liang Chen, New Taipei (TW); Yung-Fu Lin, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 27 days.

(21) Appl. No.: 16/681,949

(22) Filed: Nov. 13, 2019

(65) Prior Publication Data

US 2021/0005642 A1    Jan. 7, 2021

(30) Foreign Application Priority Data

Jul. 5, 2019   (CN) .......................... 201910605338.2

(51) Int. Cl.
*H01L 27/12* (2006.01)
*B65G 47/92* (2006.01)

(52) U.S. Cl.
CPC .......... *H01L 27/1259* (2013.01); *B65G 47/92* (2013.01); *H01L 27/1248* (2013.01)

(58) Field of Classification Search
CPC ............. H01L 27/1248; H01L 27/1259; H01L 27/124; H01L 25/167; H01L 25/165; H01L 25/0756; H01L 25/0753; B65G 47/92
See application file for complete search history.

(56) References Cited

U.S. PATENT DOCUMENTS

| 8,416,174 | B2* | 4/2013 | Yoshinaga | G06F 3/0488 345/98 |
| 9,696,768 | B2* | 7/2017 | Jeong | G06F 3/046 |
| 2008/0303774 | A1* | 12/2008 | Yoshinaga | G06F 3/046 345/98 |
| 2014/0320759 | A1* | 10/2014 | Jeong | G06F 1/1692 349/12 |
| 2017/0104009 | A1 | 4/2017 | Peng et al. | |
| 2019/0304818 | A1* | 10/2019 | Ahn | B65G 47/91 |

FOREIGN PATENT DOCUMENTS

| CN | 1967865 | A | 5/2007 |
| CN | 106571371 | A | 4/2017 |
| CN | 107808835 | A | 3/2018 |
| CN | 109378370 | A | 2/2019 |
| CN | 109755162 | A | 5/2019 |
| TW | 201626555 | A | 7/2016 |

* cited by examiner

*Primary Examiner* — Nikolay K Yushin
(74) *Attorney, Agent, or Firm* — ScienBiziP, P.C.

(57) ABSTRACT

A method for transferring light emitting elements precisely during manufacture of display panels includes providing light emitting elements; providing a first electromagnetic plate defining magnetic adsorption positions; providing a receiving substrate defining receiving areas; energizing the first electromagnetic plate to magnetically adsorb one light emitting element at one adsorption position; facing the first electromagnetic plate to the receiving substrate; and transferring the light emitting elements to one receiving area of the receiving substrate.

16 Claims, 19 Drawing Sheets

METHOD FOR TRANSFERRING LIGHT EMITTING ELEMENTS, DISPLAY PANEL, METHOD FOR MAKING DISPLAY PANEL, AND SUBSTRATE

FIELD

The subject matter herein generally relates to display field, and particularly relates to a method for transferring light emitting elements, a display panel, a method for making the display panel, and a substrate.

BACKGROUND

The size of a light emitting element such as light emitting diode (LED) generally tends towards smaller size, as a result, transferring a large number of light emitting elements to a receiving substrate is challenging.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
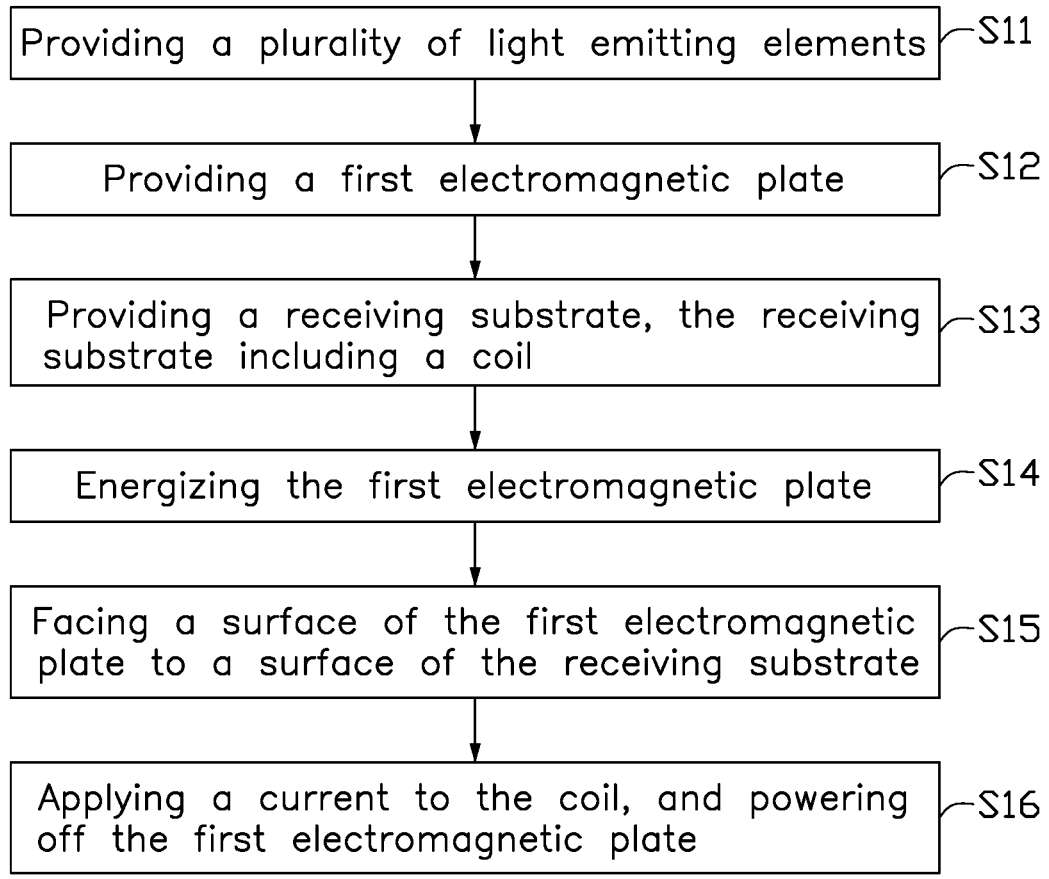
FIG. 1 is a flow chart of a method for transferring light emitting elements.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Referring to FIG. 1, a flowchart of a method for transferring light emitting elements in one embodiment is disclosed. The method is provided by way of embodiment, as there are a variety of ways to carry out the method. The method described below can be carried out using the configurations illustrated in FIGS. 2 through 15 for example, and various elements of these figures are referenced in explaining the method. Each block in this method represents one or more processes, methods, or subroutines, carried out in the method. Additionally, the illustrated order of blocks is by example only and the order of the blocks can change. The method can begin at Block S11.

Figure 2:
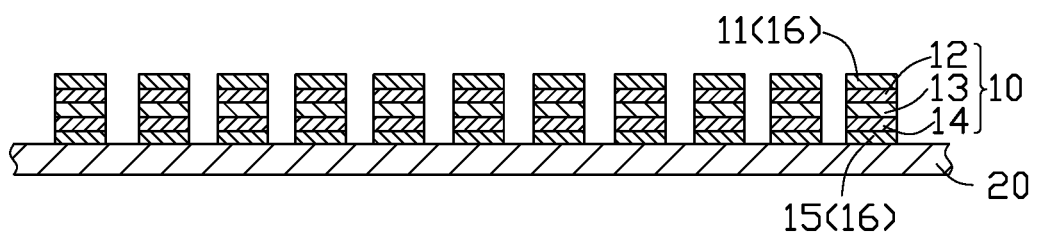
FIG. 2 is a cross-sectional view illustrating the light emitting elements during Block S11 of the method as disclosed in FIG. 1.

Block S11: a plurality of light emitting elements 10 as shown in FIG. 2 is provided.

As shown in FIG. 2, the light emitting elements 10 are spaced apart from each other on a carrier substrate 20. Each light emitting element 10 includes a P-type doped inorganic light-emitting material layer 12, an N-type doped inorganic light-emitting material layer 14, and an active layer 13 between the P-type doped inorganic light-emitting material layer 12 and the N-type doped inorganic light-emitting material layer 14.

In one embodiment, the carrier substrate 20 is a growth substrate, such as sapphire or the like. In other embodiments, the carrier substrate 20 is a platform on which the light emitting elements 10 can be placed.

In one embodiment, a first electrode 11 and a second electrode 15 are connected to opposite ends of each light emitting element 10. The first electrode 11 and the second electrode 15 may each be in the form of a magnetic material layer 16, one layer of a certain magnetic pole and the other layer 16 of opposite polarity. The P-type doped inorganic light-emitting material layer 12 is electrically connected to the first electrode 11, and the N-type doped inorganic light-emitting material layer 14 is electrically connected to the second electrode 15. That is, the first electrode 11 and the second electrode 15 are of opposite magnetic poles. For example, the magnetic pole of the first electrode 11 is N pole, the magnetic pole of the second electrode 15 is S pole, or the magnetic pole of the first electrode 11 is S pole and the magnetic pole of the second electrode 15 is N pole.

In another embodiment, the magnetic material layer 16 is not used as an electrode of the light emitting element 10. The first electrode 11 and the second electrode 15 of each light emitting element 10 are of a magnetic material layer 16 of opposite magnetic properties.

In yet another embodiment, only the first electrode 11 or only the second electrode 15 of each light emitting element 10 is in the form of a magnetic material layer 16. One end of each light emitting element 10 having the magnetic material layer 16 is arranged to face upward on the carrier substrate 20.

In one embodiment, the magnetic material layer 16 may be made of a magnetic material, such as, an aluminum-nickel-cobalt permanent magnet alloy, an iron-chromium-nickel permanent magnet alloy, a permanent magnet ferrite, other rare earth permanent magnet materials, or a composite permanent magnet material composed of the above materials.

In one embodiment, the light emitting element 10 is a conventional light emitting diode (LED), mini LED or micro LED. "Micro LED" means LED with grain size less than 100 microns. The mini LED is also a sub-millimeter LED, and its size is between conventional LED and micro LED. "mini LED" generally means LED with grain size of about 100 microns to 200 microns.

Figure 3:
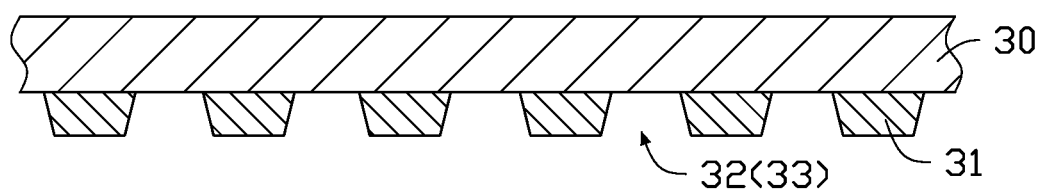
FIG. 3 is a cross-sectional view illustrating the first electromagnetic plate during Block S12 of the method as disclosed in FIG. 1.

Block S12: a first electromagnetic plate 30 as shown in FIG. 3 is provided.

The first electromagnetic plate 30 may be made of a material being magnetic when energized and having no magnetism when not energized. As shown in FIG. 3, an insulating nonmagnetic material layer 31 is on a surface of the first electromagnetic plate 30. The insulating nonmagnetic material layer 31 defines through holes 33 spaced apart from each other, and the surface of the first electromagnetic plate 30 is exposed from the through holes 33. Each through hole 33 is defined as one adsorption position 32. Each adsorption position 32 is capable of magnetically attracting one light emitting element 10 on being energized. The adjacent through holes 33 are spaced apart from each other by the insulating nonmagnetic material layer 31.

When the first electromagnetic plate 30 is energized, the positions of the through holes 33 (i.e., the exposed surface of the first electromagnetic plate 30). The plate 30 can magnetically adsorb the magnetic material layer 16 at one end of the light emitting element 10, thereby pulling one of the light emitting elements 10 in one of the through holes 33. Other positions do not adsorb any light emitting element 10. That is, when the first electromagnetic plate 30 is energized, only the positions corresponding to the through holes 33 have magnetic properties. A size of each through hole 33 is slightly larger than the size of the light emitting element 10, each of the through holes 33 can adsorb only one of the light emitting elements 10.

In one embodiment, the insulating nonmagnetic material layer 31 may be made of a polyimide-based composite material.

In one embodiment, a mechanical arm (not shown) is further provided on a side of the first electromagnetic plate 30 away from the insulating nonmagnetic material layer 31 to grasp and manipulate the first electromagnetic plate 30 in any orientation.

In one embodiment, a control circuit (not shown) is further provided corresponding to the first electromagnetic plate 30. The control circuit is configured to supply a voltage or current to the first electromagnetic plate 30 to energize the plate 30 and make it magnetic. In addition, a magnetic strength of the first electromagnetic plate 30 can be controlled by adjusting a magnitude of the voltage or current applied to the first electromagnetic plate 30 by the control circuit.

Block S13: a receiving substrate 40 is provided.

Figure 4:
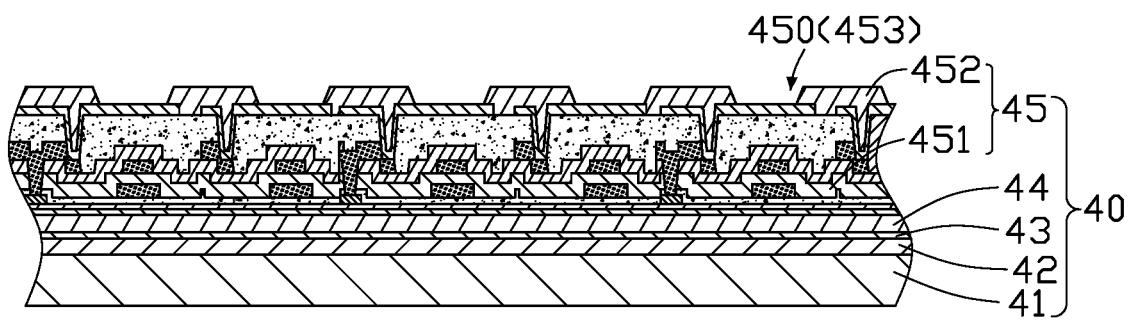
FIG. 4 is a cross-sectional view illustrating the receiving substrate during Block S13 of the method as disclosed in FIG. 1.

The receiving substrate 40 as shown in FIG. 4 includes a base layer 41, an electromagnetic circuit layer 43 on a side of the base layer 41, and a bonding layer 45 on a side of the electromagnetic circuit layer 43 away from the base layer 41. The bonding layer 45 defines a plurality of receiving areas 450, and each receiving area 450 is configured for receiving one light emitting element 10. In the first electromagnetic plate 30 shown in FIG. 3, the through holes 33 and the receiving areas 450 correspond to each other in number and position.

In one embodiment, the receiving substrate 40 is a thin film transistor (TFT) substrate. The bonding layer 45 includes a TFT array layer 451 on a side of the electromagnetic circuit layer 43 away from the base layer 41 and a pixel defining layer 452 on a side of the TFT array layer 451 away from the base layer 41. The pixel defining layer 452 defines contact holes 453 each of which exposes the TFT array layer 451. Each contact hole 453 is defined as one receiving area 450.

In one embodiment, the base layer 41 may be made of a rigid material, such as glass, quartz, silicon wafer. In other embodiments, the base layer 41 may be made of a flexible material such as polyimide (PI) or polyethylene terephthalate (PET).

In one embodiment, the receiving substrate 40 further includes an insulating layer 44 between the electromagnetic circuit layer 43 and the TFT array layer 451. The insulating layer 44 electrically insulates the electromagnetic circuit layer 43 and the thin film transistor array layer 451 to prevent the TFT array layer 451 from affecting the electromagnetic circuit layer 43 during the transfer of the light emitting elements 10. The insulating layer 44 may be made of a silicon oxide (SiOx) layer, a silicon nitride (SiNx) layer, or a multiple layer including the silicon oxide (SiOx) layer and the silicon nitride (SiNx) layer.

In one embodiment, the receiving substrate 40 further includes a barrier layer 42 between the base layer 41 and the electromagnetic circuit layer 43, to prevent moisture, corrosive oxygen, and the like from affecting the properties of the electromagnetic circuit layer 43 and the TFT array layer 451. The barrier layer 42 may be made of a silicon oxide (SiOx) layer, a silicon nitride (SiNx) layer, or a multiple layer thereof including the silicon oxide (SiOx) layer and the silicon nitride (SiNx) layer.

Figure 5:
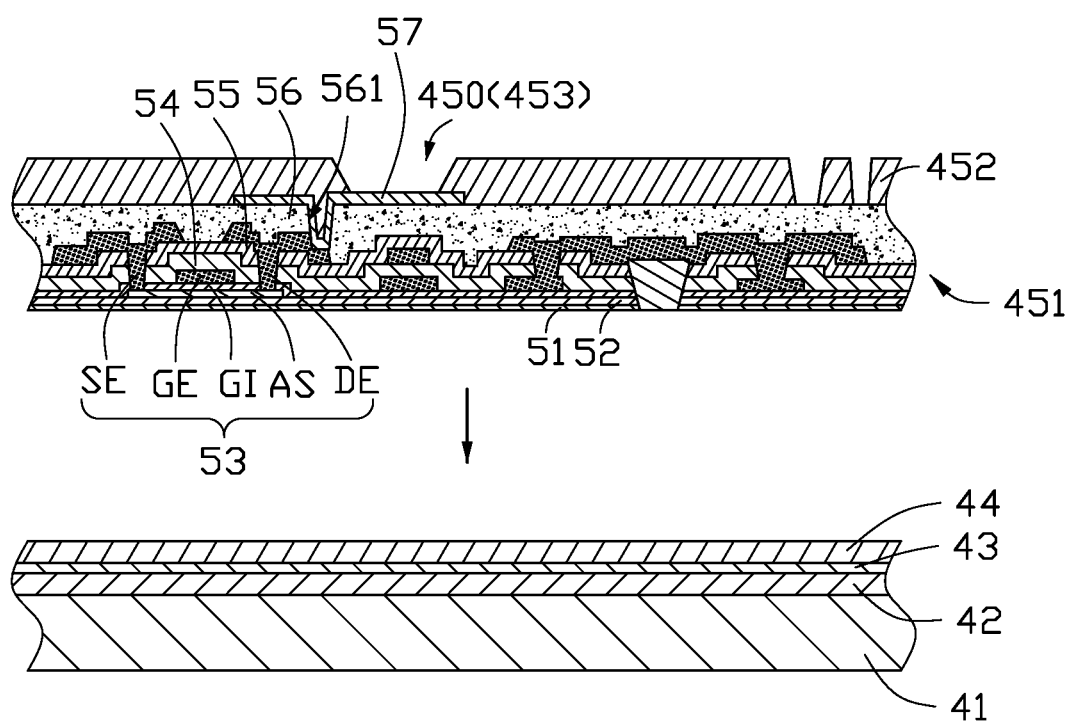
FIG. 5 shows a receiving substrate of FIG. 4 made according to the method.

As FIG. 5 indicates, the steps involved in the process of making the TFT substrate are: sequentially forming the barrier layer 42, the electromagnetic circuit layer 43, and the insulating layer 44 on the base layer 41. Then, forming the TFT array layer 451 and the pixel defining layer 452, wherein the TFT array layer 451 includes a first buffer layer 51, a second buffer layer 52, a plurality of TFTs 53 (only one is shown), a first interlayer dielectric layer 54, a second interlayer dielectric layer 55, an overcoat layer 56, and a plurality of contact electrodes 57 (only one is shown).

In one embodiment, the first buffer layer 51, the second buffer layer 52, the first interlayer dielectric layer 54, the second interlayer dielectric layer 55, and the overcoat layer 56 may be made of a silicon oxide (SiOx) layer, a silicon nitride (SiNx) layer, or multiple layers including the silicon oxide (SiOx) layer and the silicon nitride (SiNx) layer. The contact electrode 57 may be made of a non-magnetic conductive material, such as indium tin oxide (ITO), indium zinc oxide (IZO), and zinc oxide (ZnO).

As shown in FIG. 5, each of the TFTs 53 includes a gate electrode GE, a semiconductor layer AS, a gate insulating layer GI, a source electrode SE, and a drain electrode DE. The overcoat layer 56 defines vias 561, each via 561 exposes the drain electrode DE of one TFT 53. The drain electrode DE of each of the TFTs 53 is electrically connected to a contact electrode 57 through one of the vias 561. The contact hole 453 (receiving area 450) defined on the pixel defining layer 452 exposes the contact electrode 57 for electrically connecting to one of the light emitting elements 10.

In one embodiment, the gate electrode GE, the source electrode SE, and the drain electrode DE may each be made of one of molybdenum (Mo), aluminum (Al), gold (Au), titanium (Ti), and copper (Cu). In other embodiments, each of the gate electrode GE, the source electrode SE, and the drain electrode DE are multiple layers formed of one of molybdenum (Mo), aluminum (Al), gold (Au), titanium (Ti), neodymium (Nd), copper (Cu), or a combination thereof. For example, each of the gate electrode GE, the source electrode SE, and the drain electrode DE can be formed as a double layer of Mo/Al. In one embodiment, the gate electrode GE, the source electrode SE, and the drain electrode DE may be made of non-magnetic conductive materials. The gate insulating layer GI may be made of a silicon oxide (SiOx) layer, a silicon nitride (SiNx) layer, or multiple layers including the silicon oxide (SiOx) layer and the silicon nitride (SiNx) layer. The semiconductor layer AS may be made of a silicon semiconductor or an oxide semiconductor.

In one embodiment, the TFT substrate defines a plurality of pixels, and each pixel includes sub-pixels emitting light of different colors. Each sub-pixel corresponds to one light emitting element 10.

In one embodiment, each pixel includes a red (R) sub-pixel, a green (G) sub-pixel, and a blue (B) sub-pixel. The R, and B sub-pixels each correspond to one light emitting element 10 emitting red, green, and blue light, respectively.

In other embodiments, each pixel may include R, B and W (white) sub-pixels. The W sub-pixel corresponds to one light emitting element 10 emitting white light. Each pixel may further include multi-color sub-pixels, and each multi-color sub-pixel corresponds to one light emitting element 10 emitting multiple colors.

Figure 6:
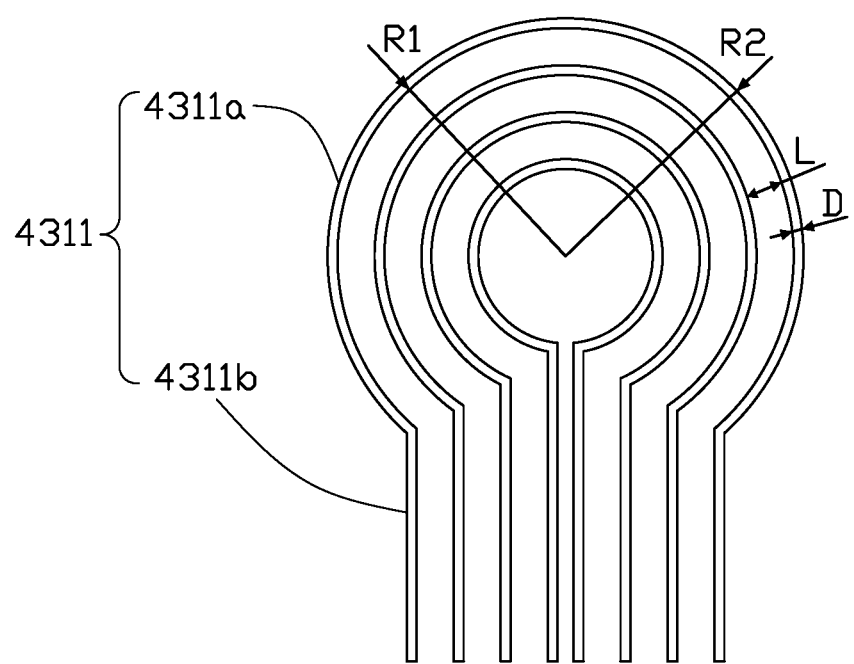
FIG. 6 is an arrangement diagram of coils of the receiving substrate shown in FIG. 5.

The electromagnetic circuit layer 43 includes a plurality of coils 4311 (labeled in FIG. 6). The coils 4311 are arranged on the same plane and are in one same layer. Each of the coils 4311 generates a magnetic field upon energization, and generates an attractive or repulsive force to a magnet (e.g., the magnetic material layer 16 of the light emitting element 10) within the magnetic field.

In one embodiment, the material of each layer between the receiving areas 450 and the electromagnetic circuit layer 43 (e.g., the insulating layer 44, the first buffer layer 51, the second buffer layer 52, the first interlayer dielectric layer 54, the second interlayer dielectric layer 55, the TFTs 53, the overcoat layer 56, and the contact electrodes 57) are made of a non-magnetic material. Therefore, the magnetic field lines of the magnetic field generated when the coils 4311 are energized can reach each receiving area 450 without blocking.

In one embodiment, the electromagnetic circuit layer 43 further includes a power supply (not shown) for supplying power to the coils 4311. The coils 4311 are electrically connected to the power supply. When a current is applied to the coils 4311 by the power supply, the coils 4311 generate a magnetic field. By adjusting the current direction flowing through the coils 4311, the magnetic pole direction of the magnetic field generated by the coils 4311 can be adjusted, thereby the direction of the magnetic force generated between the coils 4311 and the magnetic material layer 16 of each light emitting elements 10 can be controlled. By adjusting the magnitude of the current flowing through the coils 4311, the magnitude of the magnetic force generated between the coils 4311 and the magnetic material layer 16 of each light emitting element 10 can be adjusted.

In other embodiments, the electromagnetic circuit layer 43 does not include the power supply, and the coils 4311 are electrically connected to an external power supply from which the current is applied to the coils 4311.

Figure 7:
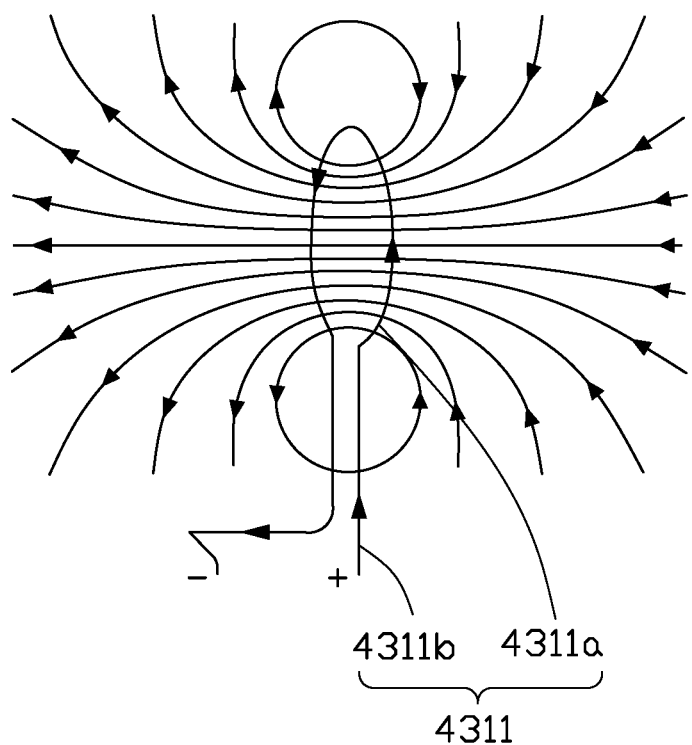
FIG. 7 is a schematic diagram of distribution of magnetic lines of force after the coils shown in FIG. 5 is energized.

As shown in FIG. 7, the coils 4311 are spaced apart from each other. Each coil 4311 includes an annular portion 4311a and two connecting portions 4311b extending from ends of the annular portion 4311a. The connecting portions 4311b of each coil 4311 are electrically connected to the power supply of the electromagnetic circuit layer 43 or to the external power supply.

The annular portions 4311a extend to form a plurality of concentric circles. Inner diameters R1 of the annular portions 4311a sequentially increase in a direction away from the center of the concentric circle, and the annular portions 4311a are equally spaced. The line width D of each coil 4311 may be the same, for example, 3.5 microns. The line pitch L of adjacent coils 4311 may be the same, for example, 5 microns. In one embodiment, the inner diameter R1 of the annular portion 4311a of each coil 4311 is at least 13 microns and the outer diameter R2 of the annular portion 4311a of each coil 4311 is not more than 50 microns. In other embodiments, the inner diameter R1 of the annular portion 4311a of each coil 4311 is at least 16 microns and the outer diameter R2 of the annular portion 4311a of each coil 4311 is not more than 90 microns. The parameters such as the line width D, the line pitch L, the inner diameter R1, and the outer diameter R2 can be adjusted according to the demand for the strength of the magnetic field.

In addition, the density of the coils 4311 can also be adjusted according to the demand for the strength of the magnetic field. That is, the coils 4311 may be arranged at unequal intervals as required by actual needs. For example, if a strong magnetic field is required, the arrangement of the coils 4311 is dense, and the line pitch L of the adjacent coils 4311 is small; if a weak magnetic field is required, the arrangement of the coils 4311 is sparse, and the line pitch L of the adjacent coils 4311 is large.

It should be noted that in the electromagnetic circuit layer 43, each coil 4311 keeps the plane of its annular portion 4311a perpendicular to a thickness direction of the receiving substrate 40, so that the direction of the magnetic field generated by each coil 4311 is approximately the thickness direction of the receiving substrate 40.

Figure 8:
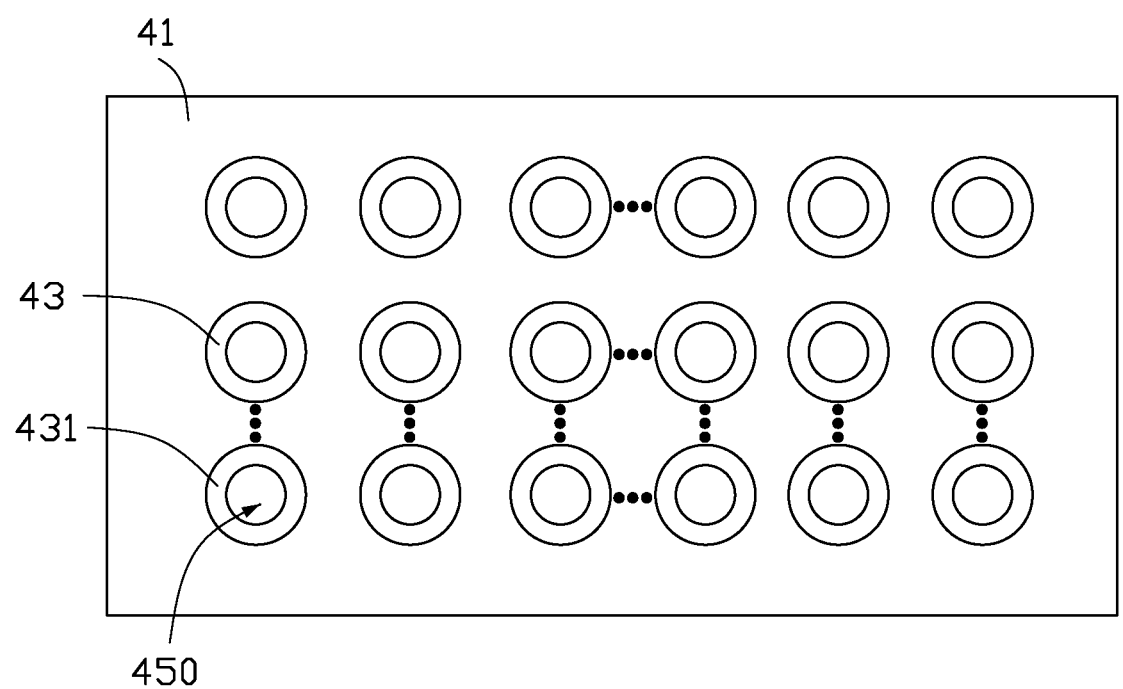
FIG. 8 shows projections of the electromagnetic unit and the receiving area of the receiving substrate shown in FIG. 4 according to an embodiment.

As shown in FIG. 8, when the coil 4311 (only one is shown) is fed with the current, the magnetic field generated by the coil 4311 is perpendicular to the plane of the annular portion 4311a of the coil 4311. That is, the direction of the magnetic field generated by the coil 4311 is approximately along the thickness direction of the receiving substrate 40.

In one embodiment, the electromagnetic circuit layer 43 is arranged over an entire surface. That is, the coils 4311 are not only arranged to correspond to the receiving areas 450, but are also arranged to correspond to positions between adjacent two receiving areas 450. The insulating layer 44 fills gaps between the adjacent coils 4311 to electrically insulate the adjacent two coils 4311.

In another embodiment, as shown in FIGS. 7 and 8, the electromagnetic circuit layer 43 is not arranged over the entire surface. The electromagnetic circuit layer 43 includes a plurality of electromagnetic units 431 spaced apart from each other. Each of the electromagnetic units 431 includes a plurality of coils 4311 (labeled in FIG. 5). Each of the electromagnetic units 431 corresponds to at least one of the receiving areas 450. The insulating layer 44 fills gaps between any adjacent two coils 4311 in one electromagnetic unit 431 and gaps between adjacent two electromagnetic units 431 to electrically insulate the coils 4311.

As shown in FIG. 8, each electromagnetic unit 431 corresponds to and aligns with one of the receiving areas 450. A projection of each electromagnetic unit 431 on the base layer 41 completely covers a projection of its corresponding receiving area 450 on the base layer 41. That is, each electromagnetic unit 431 is arranged to correspond to one sub-pixel.

Figure 9:
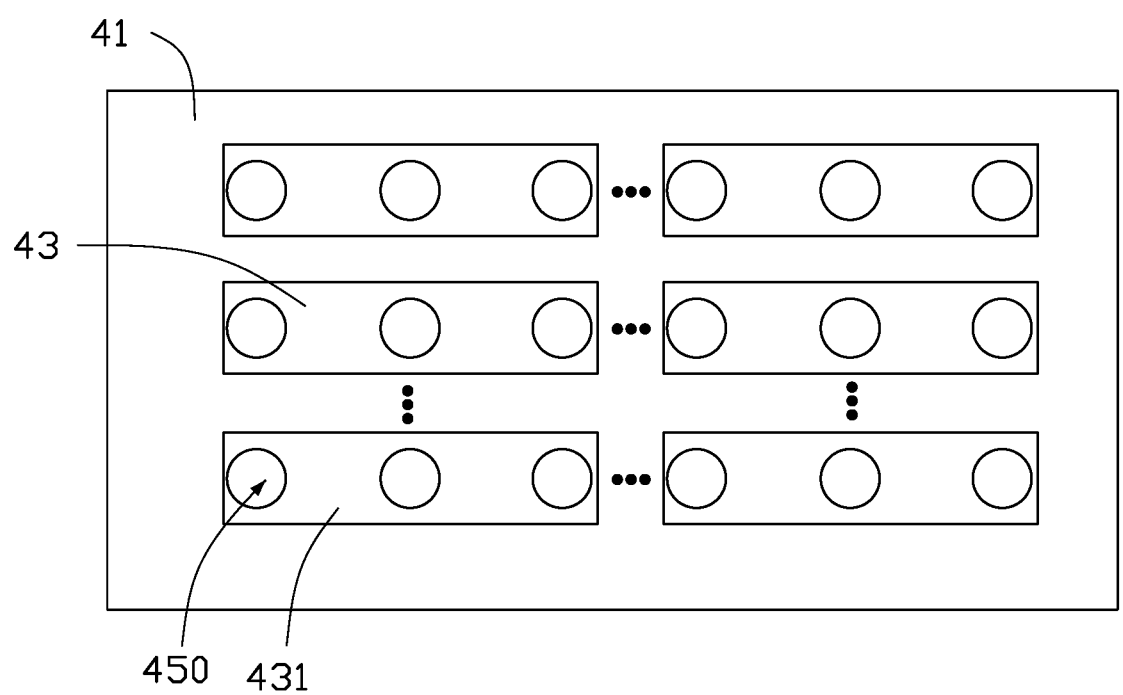
FIG. 9 shows projections of the electromagnetic unit and the receiving area of the receiving substrate shown in FIG. 4 according to another embodiment.

As shown in FIG. 9, each electromagnetic unit 431 corresponds to three adjacent receiving areas 450. The projection of each electromagnetic unit 431 on the base layer 41 completely covers the projection of its corresponding three receiving areas 450 on the base layer 41. That is, each electromagnetic unit 431 is arranged to correspond to three or more than three sub-pixels.

A shape of each electromagnetic unit 431 is not limited, for example, it may be circular as shown in FIG. 7 or rectangular as shown in FIG. 8.

Figure 10:
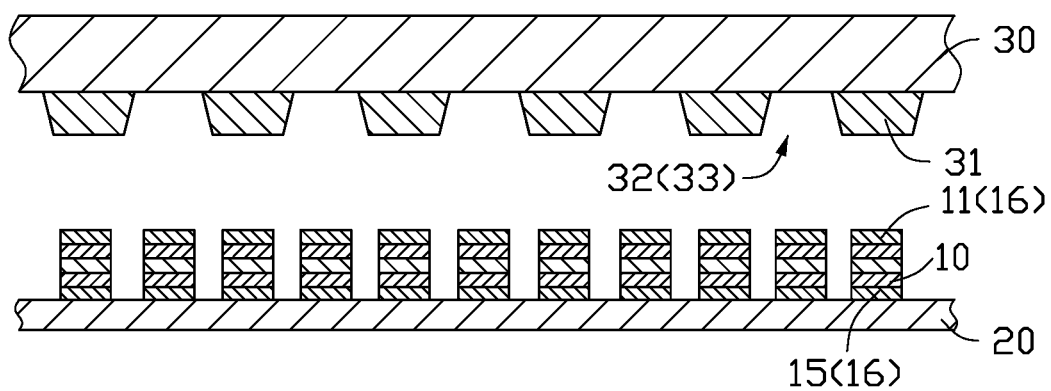
FIG. 10, FIG. 11, and FIG. 12 are cross-sectional views illustrating a resulting product during Block S14 of the method as disclosed in FIG. 1.
Figure 11:
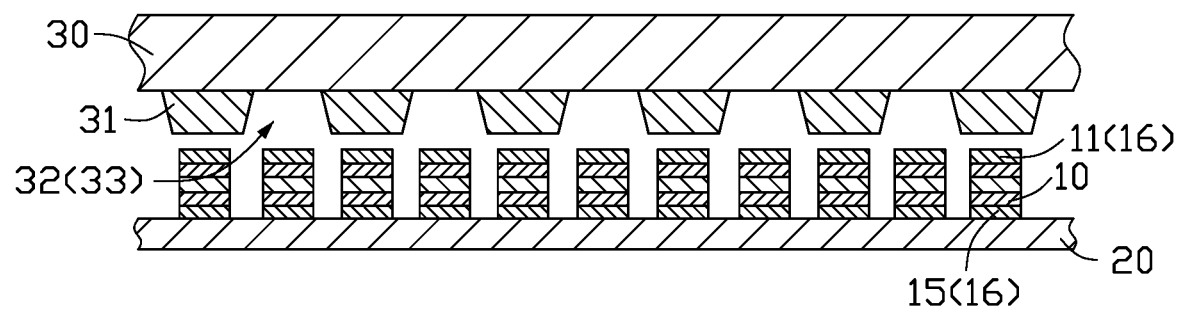

Block S14: the first electromagnetic plate 30 as shown in FIGS. 9 through 11 is energized to magnetically adsorb one light emitting element 10 from the carrier substrate 20 at each adsorption position 32.

As shown in FIG. 10, the first electromagnetic plate 30 is moved above the carrier substrate 20, and the through holes 33 are aligned one-to-one with the light emitting elements 10 on the carrier substrate 20. Each of the through holes 33 is aligned with one of the light emitting elements 10.

As shown in FIG. 11, after the through holes 33 and the light emitting elements 10 are aligned one by one, the control circuit in the first electromagnetic plate 30 is turned on, and a voltage or current is applied to the first electromagnetic plate 30 by the control circuit. When the voltage or current is applied to the first electromagnetic plate 30, the first electromagnetic plate 30 generates magnetism opposite to the magnetic pole of the first electrode 11 (i.e., magnetic material layer 16) of each light emitting element 10.

Figure 12:
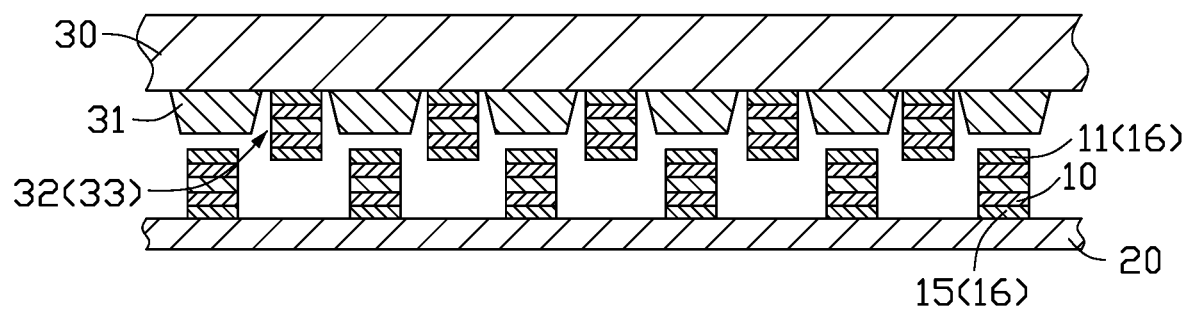

As shown in FIG. 12, the light emitting elements 10 on the carrier substrate 20 are attracted to the corresponding through holes 33 due to the magnetic force between the light emitting element 10 and the first electromagnetic plate 30. Each position of the first electromagnetic plate 30 corresponding to each through hole 33 can adsorb one light emitting element 10. The positions of the first electromagnetic plate 30 having no through holes 33 do not absorb any of the light emitting elements 10 due to the insulating non-magnetic material layer 31.

Block S15: a surface of the first electromagnetic plate 30 on which the light emitting elements 10 are magnetically adsorbed is opposite to a surface of the receiving substrate 40 defining the receiving areas 450, and the light emitting elements 10 are aligned with the receiving areas 450 one by one.

Figure 13:
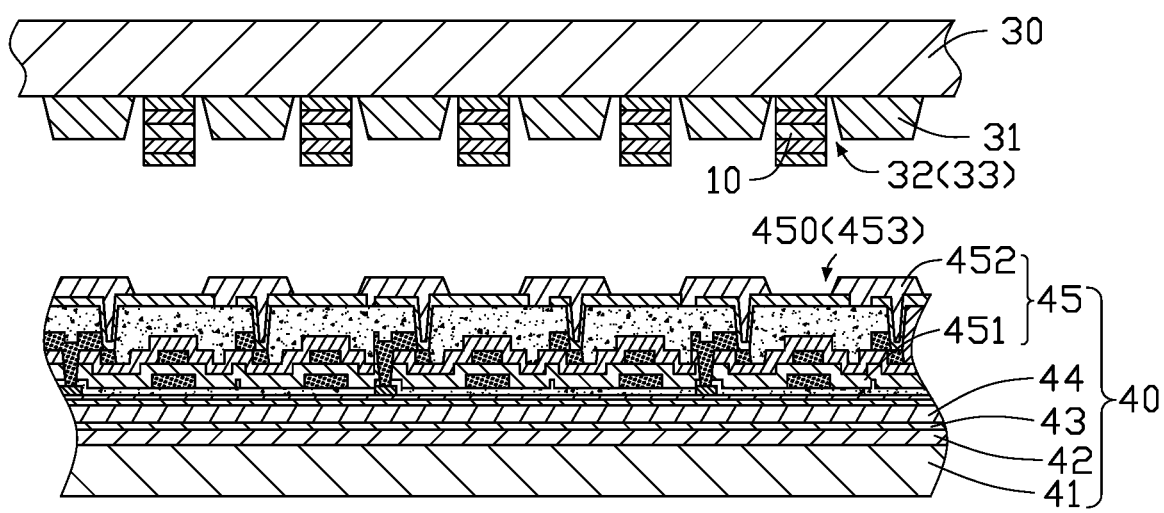
FIG. 13 is a cross-sectional view illustrating a resulting product during Block S15 of the method as disclosed in FIG. 1.

After the first electromagnetic plate 30 corresponding to the position of each through hole 33 adsorbs one light emitting element 10 as shown in FIG. 13, the first electromagnetic plate 30 remains energized, and moves over the receiving substrate 40, so that each of the light emitting elements 10 adsorbed on the first electromagnetic plate 30 is aligned one-to-one with the corresponding receiving area 450 on the receiving substrate 40.

Block S16: a current is applied to the coils 4311 to form a magnetic field, and the first electromagnetic plate 30 is switched off so that each of the light emitting elements 10 can be detached from the first electromagnetic plate 30 by the magnetic field and transferred to a corresponding receiving area 450 of the receiving substrate 40.

Figure 14:
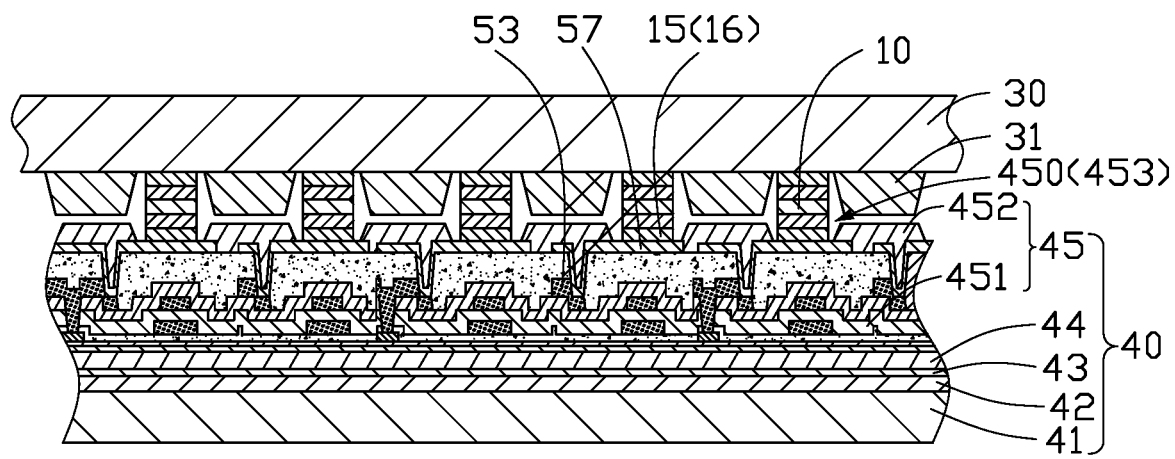
FIG. 14 and FIG. 15 are cross-sectional views illustrating the resulting product during Block S16 of the method as disclosed in FIG. 1.
Figure 15:
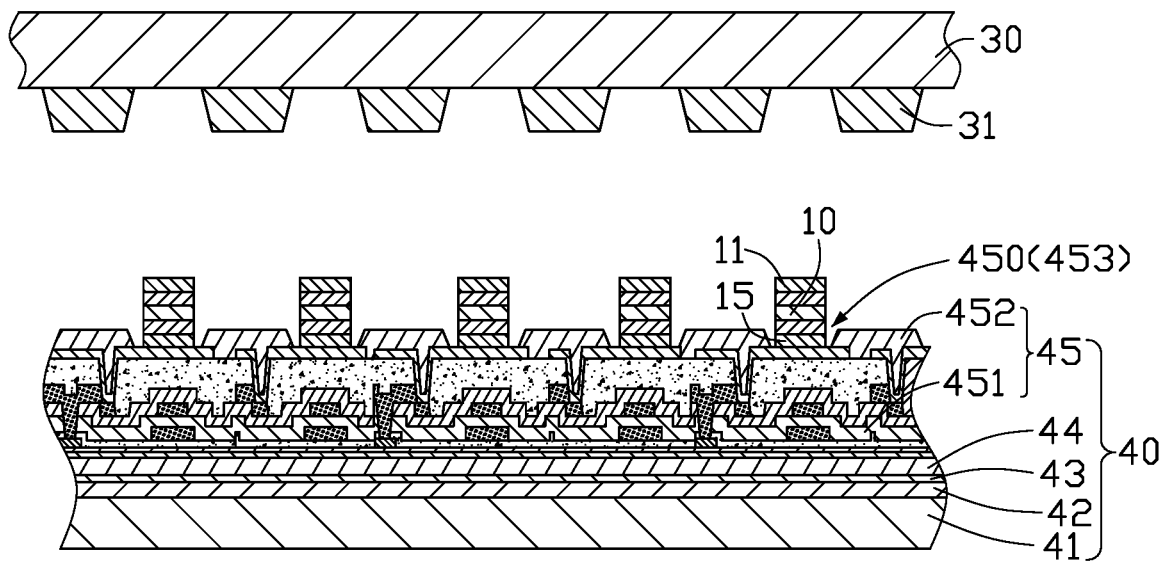

After aligning each light emitting element 10 adsorbed on the first electromagnetic plate 30 with the corresponding receiving area 450 on the receiving substrate 40, as shown in FIG. 14, the first electromagnetic plate 30 is moved toward the receiving substrate 40 so that each light emitting element 10 abuts and contacts the corresponding receiving area 450. At the same time, a current is applied to the coils 4311 in the electromagnetic circuit layer 43 to generate a magnetic field. A magnetic force between the magnetic material layer 16 of each light emitting element 10 and the coils 4311 in the electromagnetic circuit layer 43 is generated. As shown in FIG. 15, the first electromagnetic plate 30 is powered off, and each of the light emitting elements 10 and its first and second electrodes 11 and 15 are detached from the first electromagnetic plate 30 under the magnetic field and transferred to the corresponding receiving area 450. Then, the first electromagnetic plate 30 and the insulating nonmagnetic material layer 31 are removed.

It should be noted that, after the current is applied to the coils 4311 in the electromagnetic circuit layer 43, the direction of the magnetic field generated by the coils 4311 is perpendicular to the plane in which the annular portion 4311a of each coil 4311 is located. That is, the magnetic pole direction of the magnetic field is directed from the receiving substrate 40 to the first electromagnetic plate 30 or from the first electromagnetic plate 30 to the receiving substrate 40.

The direction of the magnetic field generated by the coils 4311 is established by the direction of the current flowing through the coils 4311 to cause a mutual attraction magnetic force between the coils 4311 and the magnetic material layer 16 of each of the light emitting elements 10. The magnitude of the magnetic force generated between the coils 4311 and the magnetic material layer 16 of each of the light emitting elements 10 can be adjusted by adjusting the magnitude of the current flowing through the coils 4311.

In the method, a color of light emitted from each light emitting element 10 is not limited. In this method, after the first electromagnetic plate 30 is energized, the surface of the first electromagnetic plate 30 can magnetically adsorb a large number of light emitting elements 10 at one time, thus transfer of a large quantity of light emitting elements 10 is achieved.

In one embodiment, by applying a current to the coils 4311 in the electromagnetic circuit layer 43, the magnetic field is generated, thereby generating the magnetic force between the magnetic material layer 16 of each of the light-emitting elements 10 and the coils 4311. Therefore, after the first electromagnetic plate 30 is powered off, each of the light emitting elements 10 is magnetically attracted by the coils 4311 of the receiving substrate 40 in addition to gravitational attraction. In addition, interference from magnetic lines of force around the receiving area 450 can be avoided, thereby avoiding the problem of displacement of the light emitting elements 10 during the transfer process. The alignment accuracy of the light emitting elements 10 is improved, and the transfer error is reduced.

Figure 16:
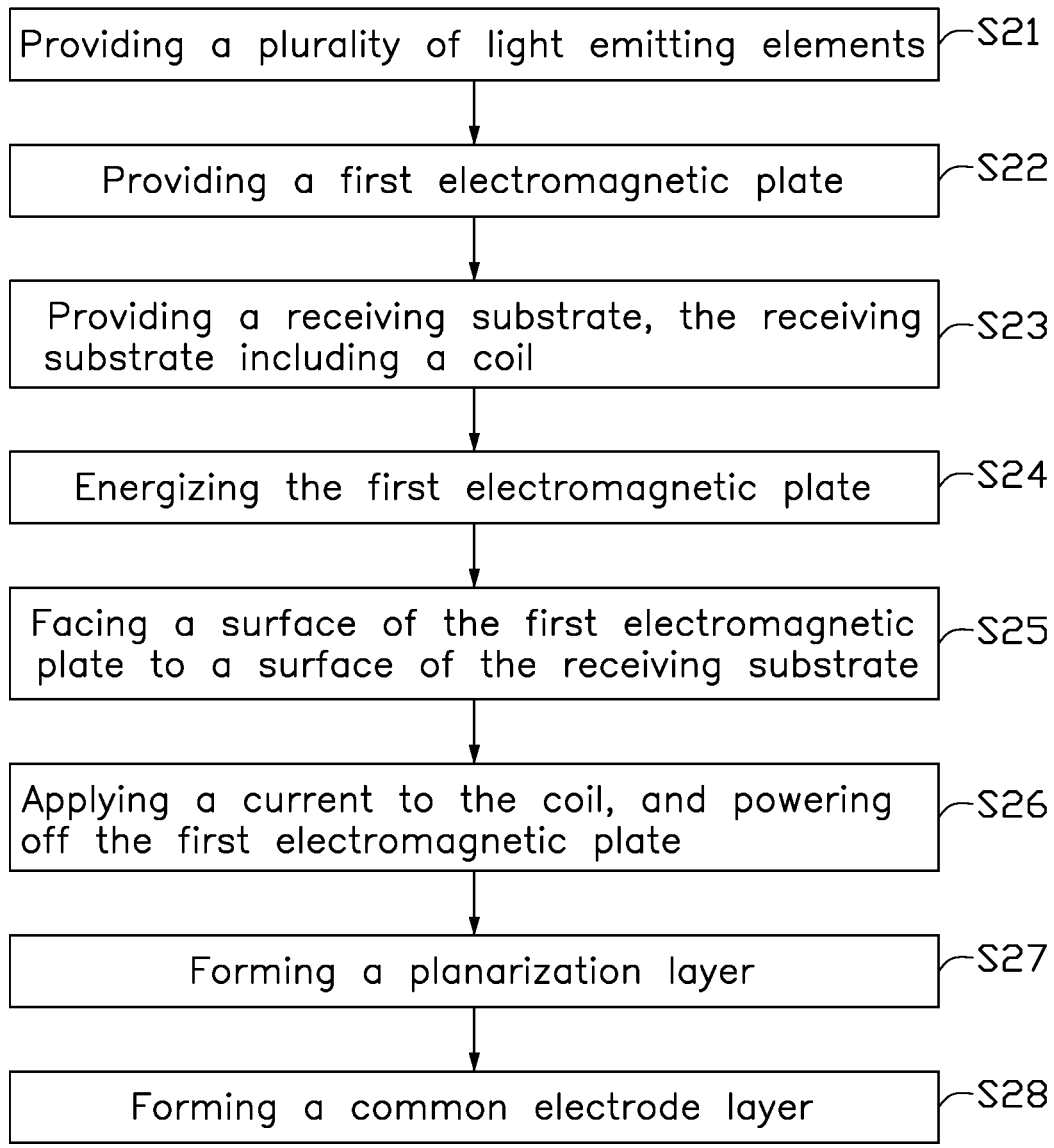
FIG. 16 is a flow chart of a method for making a display panel.

Referring to FIG. 16, a flowchart of a method for making a display panel in one embodiment is disclosed. Each block in this method represents one or more processes, methods, or subroutines, carried out in the method. Additionally, the illustrated order of blocks is by example only and the order of the blocks can change. The method can begin at Block S21.

Block S21: the light emitting elements 10 are provided.

Block S22: the first electromagnetic plate 30 is provided.

Block S23: the receiving substrate 40 is provided.

Block S24: the first electromagnetic plate 30 is energized to magnetically adsorb one light emitting element 10 at each adsorption position 32.

Block S25: a surface of the first electromagnetic plate 30 on which the light emitting elements 10 are magnetically adsorbed is opposite to a surface of the receiving substrate 40 defining the receiving areas 450, and the light emitting elements 10 are aligned with the receiving areas 450 one by one.

Block S26: a current is applied to the coils 4311 to form a magnetic field, and the first electromagnetic plate 30 is powered off so that each of the light emitting elements 10 is detached from the first electromagnetic plate 30 by the magnetic field and transferred to a corresponding receiving area 450 of the receiving substrate 40.

Blocks S21 to S26 are the same as Blocks S11 to S16 above, and will not be described here.

Block S27: a planarization layer 60 is formed on a side of the pixel defining layer 452 away from the base layer 41.

Figure 17:
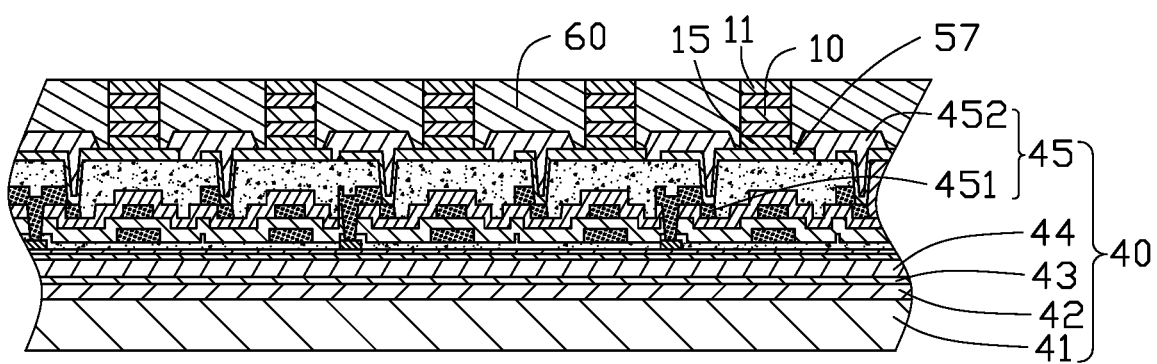
FIG. 17 is a cross-sectional view illustrating a resulting product during Block S27 of the method as disclosed in FIG. 16.

As shown in FIG. 17, the first electrode 11 of each light emitting element 10 is electrically connected to the TFT array layer 451 by one contact electrode 57, and the planarization layer 60 fills gaps between adjacent light emitting elements 10 and exposes the first electrode 11 of each light emitting element 10.

Block S28: a common electrode layer 70 is formed on the planarization layer 60.

Figure 18:
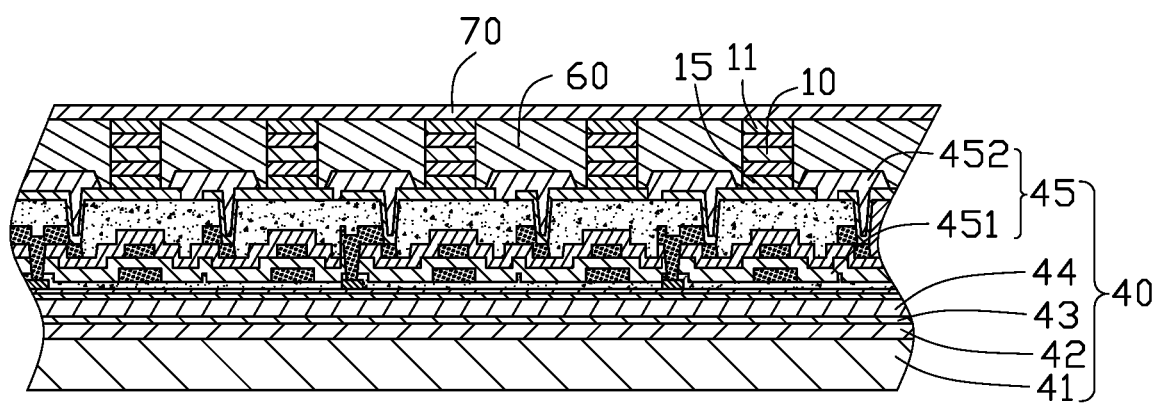
FIG. 18 is a cross-sectional view illustrating a resulting product during Block S28 of the method as disclosed in FIG. 16.

As shown in FIG. 18, the common electrode layer 70 is electrically connected to the first electrode 11 of each of the light emitting elements 10. The common electrode layer 70 may be connected to a driving circuit (not shown) by wires to apply a voltage to the first electrode 11 of the light emitting element 10. When there is a forward bias between the first electrode 11 and the second electrode 15 of the light emitting element 10, the light emitting element 10 emits light.

Figure 19:
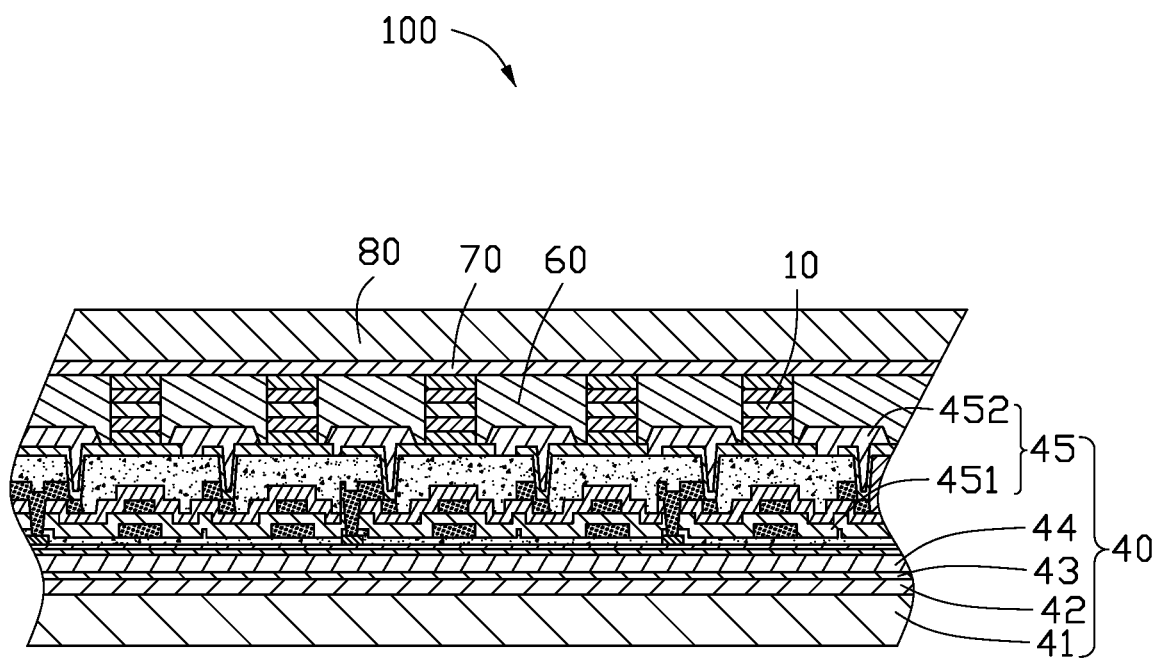
FIG. 19 is a cross-sectional view illustrating a resulting product during Block S29 of the method as disclosed in FIG. 16.

Block S29: as shown in FIG. 19, an encapsulating layer 80 is formed on a side of the common electrode layer 70 away from the planarization layer 60, thereby obtaining the display panel 100.

In one embodiment, the light emitting elements 10 provided in Block S21 are light emitting elements which emit one color of light, such as some light emitting elements emitting red light, some emitting green, some emitting blue, etc., thereby the display panel 100 would be a monochrome display panel. The monochrome display panel 100 can be applied to advertising signs, indicator lights, and the like.

In one embodiment, the light emitting elements 10 provided in Block S21 are light emitting elements emitting light of different colors, the display panel 100 is thereby a color display panel. The color display panel 100 can be applied to mobile phones, tablet computers, smart watches and the like.

It should be noted that the electromagnetic circuit layer 43 is only used in the process of transferring the light emitting element 10 to the receiving substrate 40. When the display panel 100 displays images, the electromagnetic circuit layer 43 has no function, and the electromagnetic circuit layer 43 and the TFT array layer 451 are electrically insulated by the insulating layer 44, so that the electromagnetic circuit layer 43 does not affect the light emission from the light emitting elements 10.

In one embodiment, a substrate used in a display panel is disclosed. The substrate is the receiving substrate 40, and will not be described here again.

In one embodiment, a display panel is disclosed. The display panel is the display panel 100, and will not be described again here.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method for transferring light emitting elements, comprising:
   providing a plurality of light emitting elements, wherein a magnetic material layer is on an end of each of the plurality of light emitting elements;
   providing a first electromagnetic plate, wherein the first electromagnetic plate defines a plurality of adsorption positions, wherein each of the light emitting elements is magnetically positioned and attracted to a corresponding one of the adsorption positions when the first electromagnetic plate is energized;
   providing a receiving substrate, wherein providing the receiving substrate comprising comprises providing a base layer, forming an electromagnetic circuit layer on a side of the base layer, and forming a bonding layer on a side of the electromagnetic circuit layer away from the base layer, wherein the electromagnetic circuit layer comprises a coil, the bonding layer defines a plurality of receiving areas, each of the plurality of receiving areas is configured for receiving one of the plurality of light emitting elements;
   energizing the first electromagnetic plate to magnetically adsorbs one of the plurality of light emitting elements at the corresponding one of the adsorption positions;
   facing a surface of the first electromagnetic plate on which the plurality of light emitting elements are magnetically adsorbed to a surface of the receiving substrate defining the plurality of receiving areas;
   aligning the plurality of the light emitting elements with the plurality of the receiving areas one by one; and
   applying a current to the coil to form a magnetic field, and powering off the first electromagnetic plate so that each of the plurality of light emitting elements is detached from the first electromagnetic plate by the magnetic field and transferred to the corresponding one of the receiving areas on the receiving substrate.

2. The method according to claim 1, wherein the coil comprises an annular portion, and the coil is arranged such that a plane in which the annular portion located is perpendicular to a thickness direction of the receiving substrate.

3. The method for according to claim 1, further comprising: forming an insulating nonmagnetic material layer on a surface of the first electromagnetic plate; and defining a plurality of through holes, wherein the first electromagnetic plate is exposed to the insulating nonmagnetic material layer where the plurality of through holes are, wherein the plurality of through holes are the plurality of adsorption positions.

4. The method according to claim 1, wherein forming the bonding layer further comprises forming a thin film transistor (TFT) array layer on a side of the electromagnetic circuit layer away from the base layer and forming a pixel defining layer on a side of the TFT array layer away from the base layer, wherein the pixel defining layer defines a plurality of contact holes, the TFT array layer is exposed where the plurality of contact holes are, the plurality of contact holes are the plurality of receiving areas.

5. The method for according to claim 4, wherein forming the receiving substrate further comprises forming an insulating layer between the electromagnetic circuit layer and the TFT array layer.

6. A method for making a display panel, comprising:
providing a plurality of light emitting elements, wherein a magnetic material layer is on an end of each of the plurality of light emitting elements;
providing a first electromagnetic plate, wherein the first electromagnetic plate defines a plurality of adsorption positions, each of the plurality of adsorption positions is capable of magnetically attracting one light emitting element on being energized;
providing a receiving substrate, wherein providing the receiving substrate comprising comprises providing a base layer, forming an electromagnetic circuit layer on a side of the base layer, and forming a bonding layer on a side of the electromagnetic circuit layer away from the base layer, wherein the electromagnetic circuit layer comprises a coil, the bonding layer defines a plurality of receiving areas, each of the plurality of receiving areas is configured for receiving one of the plurality of light emitting elements;
energizing the first electromagnetic plate to magnetically adsorb one of the plurality of light emitting elements at the corresponding one of the adsorption positions;
facing a surface of the first electromagnetic plate on which the plurality of light emitting elements are magnetically adsorbed to a surface of the receiving substrate defining the plurality of receiving areas;
aligning the plurality of the light emitting elements with the plurality of the receiving areas one by one; and
applying a current to the coil to form a magnetic field, and powering off the first electromagnetic plate so that each of the plurality of light emitting elements is detached from the first electromagnetic plate by the magnetic field and transferred to the corresponding one of the receiving areas on the receiving substrate.

7. The method according to claim 6, wherein the coil comprises an annular portion, and the coil is arranged such that a plane in which the annular portion located is perpendicular to a thickness direction of the receiving substrate.

8. The method according to claim 6, wherein forming the bonding layer further comprises forming a thin film transistor (TFT) array layer on a side of the electromagnetic circuit layer away from the base layer and forming a pixel defining layer on a side of the TFT array layer away from the base layer, wherein the pixel defining layer defines a plurality of contact holes, the TFT array layer is exposed where the plurality of contact holes are, the plurality of contact holes are defined as the plurality of receiving areas.

9. The method according to claim 8, wherein forming the receiving substrate further comprises forming an insulating layer between the electromagnetic circuit layer and the TFT array layer.

10. The method according to claim 8, wherein forming the TFT array layer comprises forming a plurality of thin film transistors (TFTs), each of the plurality of light emitting elements having a first electrode and a second electrode, the first electrode of each of the plurality of light emitting elements is electrically connected with one of the plurality of TFTs.

11. The method according to claim 10, after each of the plurality of light emitting elements is detached from the first electromagnetic plate by the magnetic field and transferred to a corresponding receiving area of the receiving substrate, the method further comprising forming a planarization layer on a side of the pixel defining layer away from the base layer, and the planarization layer fills a gap between adjacent two of the plurality of light emitting elements and exposes the second electrode of each of the plurality of light emitting elements.

12. The method according to claim 11, further comprising forming a common electrode layer on a side of the planarization layer away from the pixel defining layer, wherein the common electrode layer is electrically connected to the second electrode of each of the plurality of light emitting elements.

13. A substrate in a display panel, comprising:
a base layer;
an electromagnetic circuit layer on a side of the base layer, the electromagnetic circuit layer comprising a plurality of coils; and
a thin film transistor (TFT) array layer on a side of the electromagnetic circuit layer away from the base layer;
wherein the plurality of coils is spaced apart from each other, each of the plurality of coils comprises an annular portion and two connecting portions extending from ends of the annular portion, each of the plurality of coils is arranged such that a plane in which the annular portion located is perpendicular to a thickness direction of the base layer, a plurality of the annular portions extends to form a plurality of concentric circles, and inner diameters of the plurality of the annular portions sequentially increase in a direction away from the center of the plurality of concentric circles.

14. The substrate in the display panel according to claim 13, further comprising an insulating layer between the electromagnetic circuit layer and the TFT array layer.

15. The substrate in the display panel according to claim 13, further comprising a pixel defining layer on a side of the TFT array layer away from the base layer, wherein the pixel defining layer defines a plurality of contact holes, the TFT array layer is exposed where the plurality of contact holes are.

16. A display panel comprising a substrate and a plurality of light emitting elements on the substrate, wherein the substrate comprises:
a base layer;
an electromagnetic circuit layer on a side of the base layer, the electromagnetic circuit layer comprising a plurality of coils; and
a thin film transistor (TFT) array layer on a side of the electromagnetic circuit layer away from the base layer;

wherein the plurality of light emitting elements is electrically connected to the TFT array layer, and a magnetic material layer is on an end of each of the plurality of light emitting elements;

wherein the plurality of coils is spaced apart from each other, each of the plurality of coils comprises an annular portion and two connecting portions extending from ends of the annular portion, each of the plurality of coils is arranged such that a plane in which the annular portion located is perpendicular to a thickness direction of the base layer, a plurality of the annular portions extends to form a plurality of concentric circles, and inner diameters of the plurality of the annular portions sequentially increase in a direction away from the center of the plurality of concentric circles;

wherein the electromagnetic circuit layer is configured to form a magnetic field to magnetically adsorb the magnetic material layer of each of the plurality of light emitting elements in a process of transferring the plurality of light emitting elements to the substrate.

* * * * *